(12) United States Patent
Kang et al.

(10) Patent No.: US 12,144,222 B2
(45) Date of Patent: Nov. 12, 2024

(54) DISPLAY DEVICE

(71) Applicant: ELECTRONICS AND TELECOMMUNICATIONS RESEARCH INSTITUTE, Daejeon (KR)

(72) Inventors: Chan-mo Kang, Daejeon (KR); Sukyung Choi, Daejeon (KR); Chunwon Byun, Daejeon (KR); Jin Wook Shin, Daejeon (KR); Hyunsu Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 42 days.

(21) Appl. No.: 17/525,245

(22) Filed: Nov. 12, 2021

(65) Prior Publication Data
US 2022/0199706 A1   Jun. 23, 2022

(30) Foreign Application Priority Data

Dec. 17, 2020   (KR) .......................... 10-2020-0177532

(51) Int. Cl.
*H10K 59/35*   (2023.01)
*H10K 50/115*   (2023.01)

(52) U.S. Cl.
CPC ......... *H10K 59/353* (2023.02); *H10K 50/115* (2023.02)

(58) Field of Classification Search
None
See application file for complete search history.

(56) References Cited

U.S. PATENT DOCUMENTS

| | | | |
|---|---|---|---|
| 6,744,960 B2 | 6/2004 | Pelka | |
| 8,847,240 B2 | 9/2014 | Chung | |
| 9,853,232 B2 | 12/2017 | Shin et al. | |
| 10,840,471 B2 | 11/2020 | Youn et al. | |
| 11,127,913 B2 | 9/2021 | Woo et al. | |
| 11,139,346 B2 | 10/2021 | Kim et al. | |
| 2006/0157728 A1* | 7/2006 | Iou | B82Y 10/00 257/40 |
| 2008/0150423 A1* | 6/2008 | Kim | B82Y 20/00 445/24 |

(Continued)

FOREIGN PATENT DOCUMENTS

KR   20150046900 A   5/2015
KR   20150083392 A   7/2015

(Continued)

*Primary Examiner* — Erik T. K. Peterson
*Assistant Examiner* — Christopher A. Schodde
(74) *Attorney, Agent, or Firm* — Rabin & Berdo, P.C.

(57) ABSTRACT

Provided is a display device. The display device includes a substrate having a pixel area including a first sub-pixel area, a second sub-pixel area, and a third sub-pixel area, a first control layer on the substrate, a second control layer on the first control layer, an intervening layer disposed between the first control layer and the second control layer on the first sub-pixel area and the second sub-pixel area, first quantum dots on the intervening layer of the first sub-pixel area, second quantum dots on the intervening layer of the second sub-pixel area, and an organic layer configured to cover a top surface and a side surface of the intervening layer between the first control layer and the second control layer.

17 Claims, 6 Drawing Sheets

(56) References Cited

U.S. PATENT DOCUMENTS

| | | | | |
|---|---|---|---|---|
| 2010/0156277 | A1* | 6/2010 | Visser | H10K 50/84 |
| | | | | 313/504 |
| 2012/0068171 | A1* | 3/2012 | Yamana | H10K 50/854 |
| | | | | 257/40 |
| 2014/0333977 | A1 | 11/2014 | Hwang et al. | |
| 2015/0194623 | A1 | 7/2015 | Pyo et al. | |
| 2016/0293857 | A1* | 10/2016 | Huang | C09K 11/06 |
| 2017/0066963 | A1* | 3/2017 | Nick | C09K 11/025 |
| 2018/0108871 | A1* | 4/2018 | Xu | H10K 50/16 |
| 2019/0131350 | A1 | 5/2019 | Kwak et al. | |
| 2019/0228686 | A1* | 7/2019 | Tsukamoto | H10K 50/15 |
| 2019/0235320 | A1* | 8/2019 | Lin | G02F 1/133514 |
| 2019/0320517 | A1* | 10/2019 | Nakanishi | G02B 5/20 |
| 2019/0390109 | A1* | 12/2019 | Ippen | C09K 11/025 |
| 2021/0028383 | A1* | 1/2021 | Manders | H10K 50/115 |

FOREIGN PATENT DOCUMENTS

| | | |
|---|---|---|
| KR | 10-2016-0082895 A | 7/2016 |
| KR | 101791937 B1 | 11/2017 |
| KR | 20180076857 A | 7/2018 |
| KR | 10-2018-0100076 A | 9/2018 |
| KR | 10-1945514 B1 | 2/2019 |
| KR | 10-2019-0058130 A | 5/2019 |
| KR | 20190050144 A | 5/2019 |
| KR | 20190135778 A | 12/2019 |
| KR | 10-2020-0061044 A | 6/2020 |

\* cited by examiner

DISPLAY DEVICE

CROSS-REFERENCE TO RELATED APPLICATIONS

This U.S. non-provisional patent application claims priority under 35 U.S.C. § 119 of Korean Patent Application No. 10-2020-0177532, filed on Dec. 17, 2020, the entire contents of which are hereby incorporated by reference.

BACKGROUND

The present disclosure herein relates to a display device, and more particularly, to a display device including quantum dots.

A quantum dot is a material that exhibits a quantum confinement effect as a nanocrystal of a semiconductor material, which has a diameter of about 10 nm or less. Quantum dots generate light stronger than that of typical phosphors in a narrow wavelength band. The emission of the quantum dots is generated by the transition of electrons that are in an excited state from the conduction band to the valence band, and even in the case of the same material, the wavelength varies depending on a particle size of each of the quantum dots. Since the quantum dots emit light having a shorter wavelength as the size of the quantum dot becomes smaller, light having a desired wavelength range may be obtained by adjusting the size.

An emission layer containing quantum dots and various electronic devices, to which the emission layer containing the quantum dots is applied, may generally have lower manufacturing costs compared to organic light emitting elements using an emission layer and may emit light having a desired color by changing the size of the quantum dots.

SUMMARY

The present disclosure provides a display device that is easily manufactured and has an improved lifespan.

An embodiment of the inventive concept provides a display device including: a substrate having a pixel area including a first sub-pixel area, a second sub-pixel area, and a third sub-pixel area; a first control layer on the substrate; a second control layer on the first control layer; an intervening layer disposed between the first control layer and the second control layer on the first sub-pixel area and the second sub-pixel area; first quantum dots on the intervening layer of the first sub-pixel area; second quantum dots on the intervening layer of the second sub-pixel area; and an organic layer configured to cover a top surface and a side surface of the intervening layer between the first control layer and the second control layer.

In an embodiment, the first control layer may include one of an electron control layer and a hole control layer, and the second control layer may include one of the electron control layer and the hole control layer, which is different from that of the first control layer.

In an embodiment, a bottom surface of the organic layer of the first sub-pixel area may be disposed at a vertical level higher than that of a bottom surface of the organic layer of the third sub-pixel area.

In an embodiment, each of the first quantum dots may have a diameter different from that of each of the second quantum dots.

In an embodiment, the intervening layer may have an energy level between the first quantum dots and the first control layer.

In an embodiment, the intervening layer may have a dipole moment that reduces an energy barrier between the first quantum dots and the first control layer.

In an embodiment, the intervening layer may include an insulating material.

In an embodiment, a top surface of the organic layer of the first sub-pixel area may be disposed at a vertical level higher than that of a top surface of the organic layer of the third sub-pixel area.

In an embodiment, the display device may further include: lower electrodes between the substrate and the first control layer; and an upper electrode on the second control layer.

In an embodiment, a top surface of the upper electrode of the first sub-pixel area may be disposed at a vertical level higher than that of a top surface of the upper electrode of the third sub-pixel area.

In an embodiment, the third sub-pixel area may be configured to generate blue light.

In an embodiment, the intervening layer may have a first portion on the first sub-pixel area and a second portion on the second sub-pixel area, and a top surface of the first portion may be disposed at a vertical level higher than that of a top surface of the second portion.

In an embodiment of the inventive concept, a display device includes: a substrate having a pixel area including a first sub-pixel area and a second sub-pixel area; a first lower electrode on the first sub-pixel area; a second lower electrode on the second sub-pixel area; a first control layer configured to cover the first lower electrode and the second lower electrode; a second control layer on the first control layer; an organic layer between the first control layer and the second control layer; and quantum dots within the organic layer of the first sub-pixel area, wherein a bottom surface of the organic layer of the first sub-pixel area is disposed at a vertical level higher than that of a bottom surface of the organic layer of the second sub-pixel area.

In an embodiment, the display device may further include an intervening layer disposed between the quantum dots a dots and the first control layer, wherein the intervening layer may have a side surface between the first lower electrode and the second lower electrode.

In an embodiment, the first control layer may include one of an electron control layer and a hole control layer, and the second control layer may include one of the electron control layer and the hole control layer, which is different from that of the first control layer.

In an embodiment, the display device may further include an upper electrode on the second control layer, wherein the upper electrode may vertically overlap the first lower electrode and the second lower electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Embodiments of the inventive concept will be described with reference to the accompanying drawings so as to sufficiently understand constitutions and effects of the inventive concept. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific embodiment while not limiting the present invention. In this specification, the terms of a singular form may include plural forms unless specifically mentioned. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first and a second are used to describe various areas and layers (or films) in various embodiments of the present invention, the areas and the layers are not limited to these terms. These terms are used only to discriminate one area or layer (or film) from another area or layer (or film). Therefore, a layer referred to as a first layer in one embodiment can be referred to as a second layer in another embodiment. An embodiment described and exemplified herein includes a complementary embodiment thereof. Like reference numerals refer to like elements throughout.

Unless terms used in embodiments of the present invention are differently defined, the terms may be construed as meanings that are commonly known to a person skilled in the art.

Figure 1:
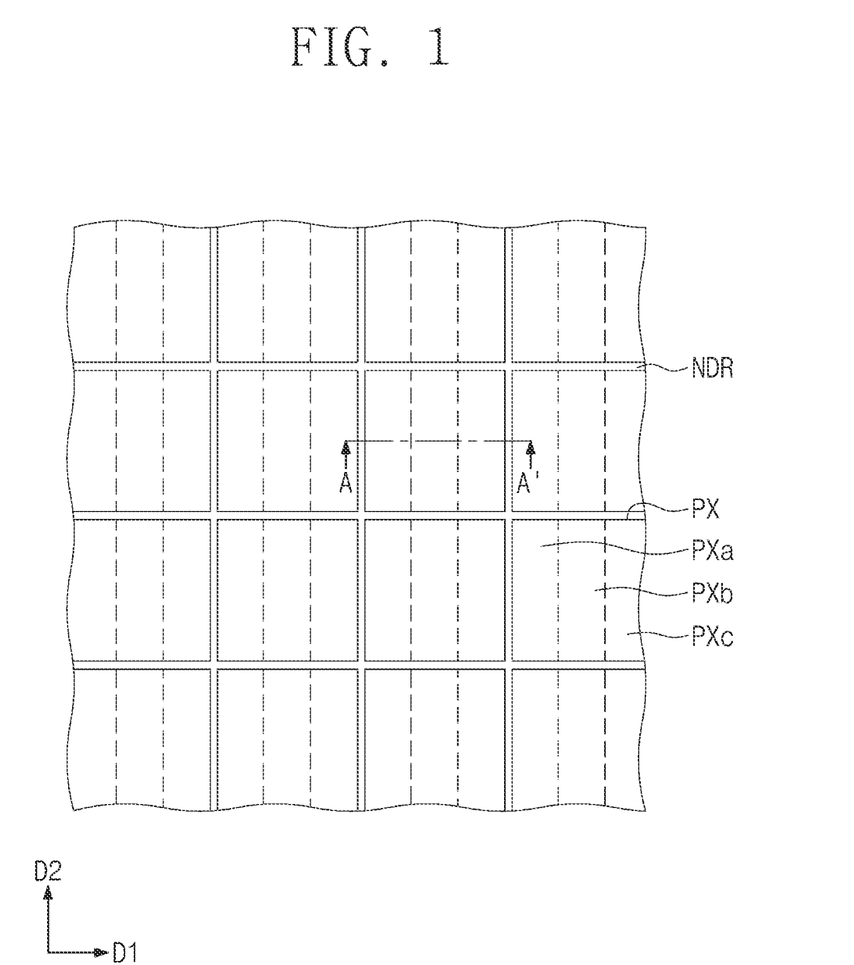
FIG. 1 is a plan view of a display device according to embodiments of the inventive concept.
Figure 2:
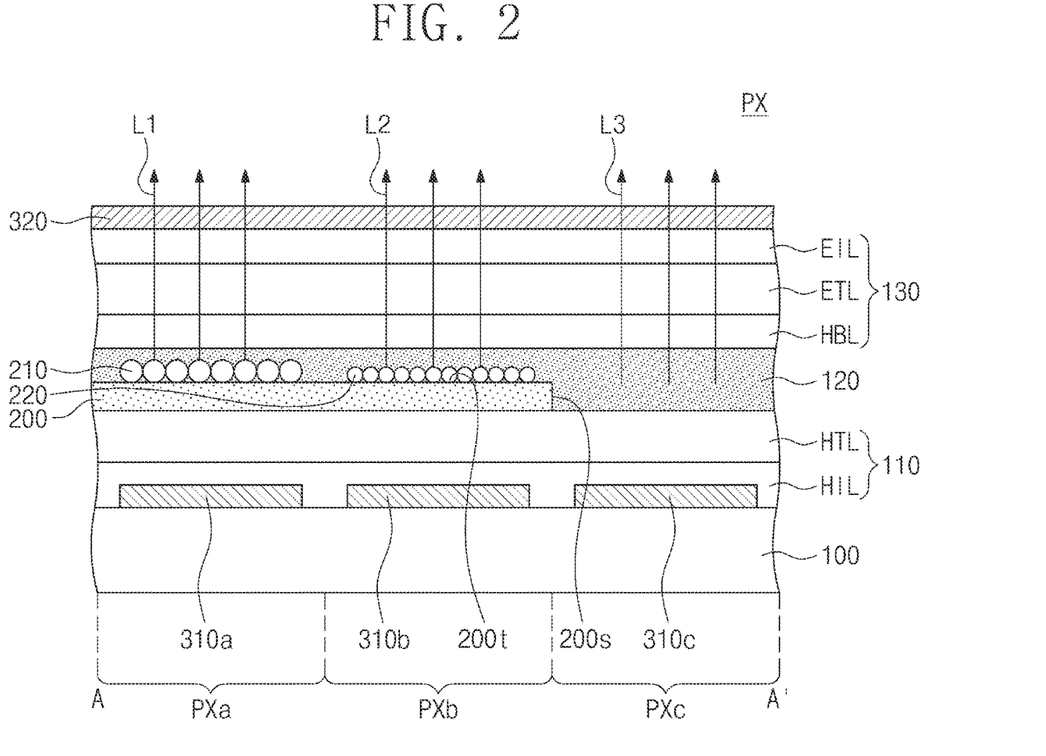
FIG. 2 is a cross-sectional view taken along line A-A' of FIG. 1.
Figure 3:
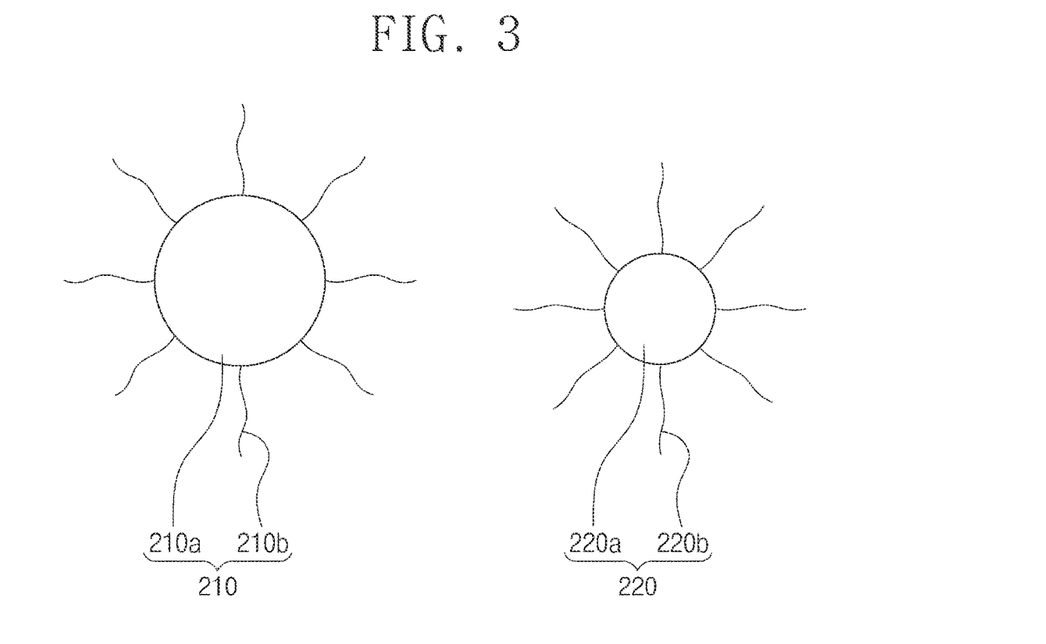
FIG. 3 is an enlarged view of quantum dots according to embodiments of the inventive concept.

FIG. 1 is a plan view of a display device according to embodiments of the inventive concept. FIG. 2 is a cross-sectional view taken along line A-A' of FIG. 1. FIG. 3 is an enlarged view of quantum dots according to embodiments of the inventive concept;

Referring to FIG. 1, a display device may include pixel areas PX displaying colors and a non-display area NDR adjacent to the pixel areas PX.

The pixel areas PX may be spaced apart from each other with the non-display area NDR therebetween. The pixel areas PX may be arranged in a two-dimensional matrix shape. Each of the pixel areas PX may function as unit pixels for displaying an image. Each of the pixel areas PX may be configured to generate at least one of blue light, red light, green light, or white light. Each of the pixel areas PX may have, for example, a square shape.

Each of the pixel areas PX may include a first sub-pixel area PXa, a second sub-pixel area PXb, and a third sub-pixel area PXc. According to embodiments, the first sub-pixel area PXa, the second sub-pixel area PXb, and the third sub-pixel area PXc may be sequentially arranged in a first direction. Each of the sub-pixel areas PXa, PXb, and PXc may have a width in a second direction D2, which is greater than a width in the first direction D1. For example, each of the sub-pixel areas PXa, PXb, and PXc may have a rectangular shape.

Referring to FIGS. 1 and 2, the first sub-pixel area PXa, the second sub-pixel area PXb, and the third sub-pixel area PXc may be configured to generate light having different wavelengths. For example, the first sub-pixel area PXa may generate first light L1, and the first light L1 may be red light. For example, the second sub-pixel area PXb may generate second light L2, and the second light L2 may be green light. For example, the third sub-pixel area PXc may generate third light L3, and the third light L3 may be blue light. Each of the sub-pixel areas PXa, PXb, and PXc constituting one pixel area PX may emit light or not emit light to determine a color of the one pixel area PX.

According to embodiments, each of the pixel areas PX may include additional sub-pixel areas in addition to the first sub-pixel area PXa, the second sub-pixel area PXb, and the third sub-pixel area PXc. For example, each of the first sub-pixel area PXa, the second sub-pixel area PXb, and the third sub-pixel area PXc may have a square shape and may be arranged in the form of a 2×2 or 3×3 matrix together with the additional sub-pixel areas. According to embodiments, one pixel area PX may have two or more sub-pixel areas emitting green light.

Referring again to FIG. 2, the display device includes a substrate 100, a first control layer 110, a second control layer 130, an organic layer 120, an intervening layer 200, and quantum dots 210 and 220, lower electrodes 310*a*, 310*b*, and 310*c*, and an upper electrode 320.

The substrate 100 may include a pixel area including the first sub-pixel area PXa, the second sub-pixel area PXb, and the third sub-pixel area PXc and a driving circuit for driving the pixel area. For example, the substrate 100 may include a base layer and a circuit layer on the base layer. The base layer may include, for example, silicon. The circuit layer may include, for example, transistors and lines disposed on the base layer.

Lower electrodes 310*a*, 310*b*, and 310*c* may be disposed on the substrate 100. The lower electrodes 310*a*, 310*b*, and 310*c* may include a first lower electrode 310*a* on the first sub-pixel area 310*a*, a second lower electrode 310*b* on the second sub-pixel area 310*b*, and a third lower electrode 310*c* on the third sub-pixel area 310*c*. The lower electrodes 310*a*, 310*b*, and 310*c* may be connected to the driving circuit of the substrate 100 to provide an electrical signal to the organic layer 120. The first lower electrode 310*a*, the second lower electrode 310*b*, and the third lower electrode 310*c* may be controlled independently of each other so that the first sub-pixel area PXa, the second sub-pixel area PXb, and the third sub-pixel area PXc emit light or do not emit light. Each of the first lower electrode 310*a*, the second lower electrode 310*b*, and the third lower electrode 310*c* may be a transmissive electrode, a transflective electrode, or a reflective electrode. Each of the first lower electrode 310*a*, the second lower electrode 310*b*, and the third lower electrode 310*c* may include, for example, a metal, an alloy, and/or a conductive compound.

The first control layer 110 may be disposed on a top surface of the substrate 100. The first control layer 110 may cover top surfaces and side surfaces of the lower electrodes 310*a*, 310*b*, and 310*c*. The first control layer 110 may be a hole control layer that provides holes in the organic layer 120. The first control layer 110 may include a hole injection layer HIL and a hole transport layer HTL.

The hole injection layer HIL may be disposed on the top surface of the substrate 110 to cover the lower electrodes 310a, 310b, and 310c. The hole injection layer HIL may include, for example, at least one of a phthalocyanine compound, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2-TNATA), poly(3,4-ethylenedioxythiophene)/poly(4-styrenesulfonate (PEDOT/PSS), polyaniline/dodecylbenzenesulfonic acid (PANI/DBSA), polyaniline/camphor sulfonicacid (PANI/CSA), and polyaniline/poly(4-styrenesulfonate) (PANI/PSS), N,N'-di(naphthalene-1-yl)-N,N'-diphenyl-benzidine (NPB), polyether ketones containing triphenylamine (TPAPEK), 4-Isopropyl-4'-methyldiphenyliodonium Tetrakis(pentafluorophenyl)borate], dipyrazino[2,3-f:2',3'-h] quinoxaline-2,3,6,7,10,11-hexacarbonitrile (HAT-CN), or transition metal oxide. The hole injection layer HIL may have a thickness of, for example, about 1 nm to about 10 nm.

A hole transport layer HTL may be disposed on the hole injection layer HIL. The hole transport layer HTL may receive the holes from the holes injection layer HIL to transfer the holes to the organic layer 120. The hole transport layer HTL may have a thickness greater than that of the hole injection layer HIL. The hole transport layer HTL may have a thickness of, for example, about 10 nm to about 200 nm. The hole transport layer HTL may include, for example, at least one of a carbazole-based derivative such as N-phenylcarbazole and polyvinylcarbazole, a fluorine-based derivative, a triphenylamine-based derivative such as N,N'-bis(3-methylphenyl)-N,N'-diphenyl-[1,1-biphenyl]-4,4'-diamine (TPd) and 4,4',4"-tris(N-carbazolyl)triphenylamine (TCTA), N,N'-di(naphthalene-1-yl)-N,N'-diphenyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), or mCP (1,3-Bis(N-carbazolyl) benzene).

The intervening layer 200 may be disposed on a top surface of the hole transport layer HTL. The intervening layer 200 may be interposed between the first control layer 110 and quantum dots 210 and 220 on the first sub-pixel area PXa and the second sub-pixel area PXb. The intervening layer 200 may extend from the first sub-pixel area PXa to the second sub-pixel area PXb and may not extend onto the third sub-pixel area PXc. In other words, the intervening layer 200 may cover a top surface of the first control layer 110 of the first sub-pixel area PXa and the second sub-pixel area PXb may not cover a top surface of the first control layer 110 of the third sub-pixel area PXc. The intervening layer 200 may vertically overlap the first lower electrode 310a and the second lower electrode 310b to control an electrical signal transmitted from the first lower electrode 310a and the second lower electrode 310b to the quantum dots 210 and 220. The intervening layer 200 may have a side surface 200s disposed between the second lower electrode 310b and the third lower electrode 310c so as not to overlap the third lower electrode 310c. Thus, the intervening layer 200 may not interfere with the electric signal transmitted from the third lower electrode 310c to the organic layer 120 of the third sub-pixel area PXc.

The intervening layer 200 may have a valence band level greater than that of the quantum dots 210 and 220 and a valence band level less than that of the first control layer 110. Specifically, the intervening layer 200 may contain a material having an energy level, which is greater than the valence band level of the material contained in the quantum dots 210 and 220 and lower than the valence band level of the material contained in the first control layer 110. The intervening layer 200 may include, for example, at least one of a carbazole-based derivative, a fluorine-based derivative, a triphenylamine-based derivative, phenyl silane-based derivatives such as bis(2-methylphenyl)diphenylsilane (UGH), and 1,4-Bis(triphenylsilyl)benzene (UGH2), phenanthroline derivatives such as BPhen (bathophenanthroline), or poly[(9,9-dioctylfluorenyl-2,7-diyl)-co-(4,4'-(N-(4-sec-butylphenyl))diphenylamine)] (TFB).

According to embodiments, the intervening layer 200 may also be a material that forms a dipole moment. Specifically, the dipole moment formed by the intervening layer 200 may reduce an energy barrier formed by a difference between the valence band level of the quantum dots 210 and 220 and a highest occupied molecular orbital (HOMO) level of the first control layer 110. The intervening layer 200 may include, for example, at least one of a fluorene-based compound, a transition metal oxide, LiF, a lithium-based compound such as Liq(8-Quinolinolato Lithium), HAT-CN, a trichlorosilane-based compound, a triethoxysilane-based compound, a trimethoxysilane compound, bis(trimethylsilyl)amine (HMDS), an alkyl phosphate compound, or an alkylcarboxylic acid compound.

According to embodiments, the intervening layer 200 may be configured to control an amount of electrons injected from the first control layer 110 to the quantum dots 210 and 220. For example, the intervening layer 220 may reduce the amount of electrons injected from the first control layer 110 into the quantum dots 210 and 220 and may not completely block the quantum dots 210 and 220 injected from the first control layer 110 to the quantum dots 210 and 220. The intervening layer 200 may include an insulating material and may have a thin thickness. The intervening layer 200 may have a thickness less than that of each of the first control layer 110, the second control layer 130, and the organic layer 120. The intervening layer 200 may have a thickness in the range of, for example, about 0.1 nm to about 10 nm. When the intervening layer 200 has a thickness of about 10 nm or more, the quantum dots 210 and 220 may not be excited, and when the intervening layer 200 has a thickness of about 0.1 nm or less, the amount of electrons injected into the quantum dots 210 and 220 may not be reduced. The intervening layer 200 may include, for example, at least one of polyvinyl alcohol, polyvinyl butyral, polyvinyl carbazole, acrylate and methacrylate-based derivatives such as polymethyl methacrylate, polyethylrel glycol diacrylate, and polyurethane acrylate, or oxides such as $SiO_x$, $SiN_x$, $AlO_x$, $ZrO_x$, $HfO_x$, $MgO_x$, $CaO_x$, $YO_x$, $LaO_x$, $TaO_x$, $BaO_x$ and $SrO_x$. The quantum dots 210 and 220 may be disposed on a top surface of the intervening layer 200. The quantum dots 210 and 220 may include first quantum dots 210 on the first sub-pixel area PXa and second quantum dots 220 on the second sub-pixel area PXb. The quantum dots may include materials exhibiting a quantum confinement effect as nano-scale semiconductor crystals. The quantum dots 210 and 220 may be excited by receiving energy from the organic layer 120. The quantum dots 210 and 220 will be described in more detail later with reference to FIG. 3.

The organic layer 120 may be disposed between the first control layer 110 and the second control layer 130 to cover the intervening layer 200 and the quantum dots 210 and 220. The organic layer 120 may cover a top surface 200t and a side surface 200s of the intervening layer 200 on the first sub-pixel area PXa and the second sub-pixel area PXb. The organic layer 120 may cover a top surface of the hole transport layer HTL on the third sub-pixel area PXc. Thus, a bottom surface of the organic layer 120 of the first sub-pixel area PXa and the second sub-pixel area PXb may be disposed at a vertical level greater than that of a bottom surface of the organic layer 120 of the third sub-pixel area PXc.

The organic layer 120 may include a blue light emitting material. For example, the organic layer 120 may include one of oxadiazole dimer dyes (Bis-DAPDXP), spiro compounds (Spiro-DPVBi, Spiro-6P), triarylamine compounds, bis(styryl)amine) (DPVBi, DSA), 4,4'-bis(9-ethyl-3-carbazovinylene)-1,1'-biphenyl (BCzVBi), perylene, 5,8,11-tetra-tert-butyl perylene (TPBe), carbazole-3,3'-(1,4-phenylene-di-2,1-ethen-diyl)bis[9-ethyl-(9C)] (BCzVB), 4,4-bis[4-(di-p-tolylamino)styryl]biphenyl (DPAVBi), 4-[(di-p-tolylamino)styryl]stilbene (DPAVB), 4,4'-bis[4-(diphenylamino)styryl]biphenyl (BDAVBi), and bis(3,5-difluoro-2-(2-pyridyl)phenyl-(2-carboxypyridyl) iridium III (FIrPic). In addition, the organic layer 120 may include a polymer light emitting material such as a polyfluorene-based polymer or a polyvinyl-based polymer.

The intervening layer 200 on the first sub-pixel area PXa and the second sub-pixel area PXb may receive a charge carrier from the first lower electrode 310a and the second lower electrode 310b to deliver the charge carrier to the quantum dots 210 and 220. The organic layer 120 on the first sub-pixel area PXa and the second sub-pixel area PXb may receive a charge carrier from the upper electrode 320 to deliver the charge carrier to the quantum dots 210 and 220. The charge carriers provided from the upper electrode 320 and the lower electrodes 310a and 310b to the quantum dots may have different electrical polarities. The quantum dots 210 and 220 may be excited by receiving the charge carriers to generate light having a wavelength corresponding to a diameter and material of each of the quantum dots 210 and 220. The first quantum dots 210 may generate light having a wavelength greater than that of the second quantum dot 220. For example, the first quantum dots 210 may generate the first light L1 having a wavelength in the range of about 600 nm to about 670 nm. The second quantum dots 220 may generate the second light L2 having a wavelength in the range of about 480 nm to about 570 nm. Each of the first quantum dots 210 may have a core size greater than that of the second quantum dot 220. The first quantum dot 210 may have, for example, a core size in the range of about 2 nm to about 8 nm. Each of the second quantum dots 220 may have, for example, a core size in the range of about 1 nm to about 4 nm.

The organic layer 120 on the third sub-pixel area PXc may receive a charge carrier from the third lower electrode 310c to generate third light L3 having a wavelength less than that of each of the first light L1 and the second light L2. The third light L3 may have a wavelength of about 420 nm to about 500 nm. The charge carrier provided by the third lower electrode 310c may not be controlled by the intervening layer 200, but be directly delivered to the organic layer 120 on the third sub-pixel area PXc. The organic layer 120 may be excited by receiving the charge carrier and may directly emit light.

According to embodiments, as illustrated in FIG. 3, the first quantum dot 210 may include a first core shell 210a and first ligands 210b. The second quantum dot 220 may include a second core shell 220a and first ligands 220b. The core shells 210a and 220a of the quantum dots 210 and 220 may include nano-scale semiconductor crystals. Each of the core shells 210a and 220a of the quantum dots 210 and 220 may have, for example, a spherical shape. The core shells 210a and 220a of the quantum dots 210 and 220 may include one of Group II-VI compound, Group III-V compound, Group IV-VI compound, Group IV element, Group IV compound, and a combination thereof.

For example, the Group II-VI compounds may include one of binary element compounds selected from the group consisting of CdSe, CdTe, ZnS, ZnSe, ZnTe, ZnO, HgS, HgSe, HgTe, MgSe, MgS, and a combination thereof, ternary element compounds selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a combination thereof.

For example, the Group III-V compounds may include one of binary element compounds selected from the group consisting of GaN, GaP, GaAs, GaSb, AN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a combination thereof, and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

For example, the Group IV-VI compounds may include one of binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof. For example, the group IV element may include one of Si, Ge, and a mixture thereof, and the group IV compound may include one of SiC, SiGe, and a mixture thereof.

The ligands 210a and 220a may be disposed on surfaces of the core shells 210a and 220a. Contents of the ligands 210a and 220a in the quantum dots 210 and 220 may have values in the range of about 3 wt % to about 8 wt % of the quantum dots 210 and 220, respectively. Each of the ligands 210a and 220a may have a hydrophobic residue. The ligands 210a and 220a are attached to the surfaces of the cores 210a and 220a, and each of the quantum dots 210 and 220 may be hydrophobic.

The second control layer 130 may be provided on the organic layer 120. The second control layer 130 may include a hole blocking layer HBL, an electron transport layer ETL, and an electron injection layer EIL, which are sequentially laminated. The hole blocking layer HBL may prevent the holes provided from the first control layer 110 from being transferred into the second control layer 130. The electron transport layer ETL and the electron injection layer EIL may receive electrons from the upper electrode 320 to transfer the electrons to the organic layer 120. The electron transport layer ETL may have a thickness greater than that of the electron injection layer EIL. The electron transport layer ETL may have a thickness of, for example, about 10 nm to about 200 nm. The electron injection layer EIL may have a thickness of, for example, about 1 nm to about 10 nm.

For example, the electron transport layer ETL may include one of tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1, O8)-(1,1'-Biphenyl-4-olato)aluminum (BAlq), berylliumbis (benzoquinolin-10-olate (Bebq2), and 9,10-di(naphthalene-2-yl)anthracene (ADN).

The electron injection layer EIL may include, for example, a lanthanide metal such as Ca, Mg, Li, LiF, Liq, Li2O, BaO, NaCl, CsF, and Yb or a halide metal such as RbCl or RbI, and a material in which an electron transport material and organo metal salt having an insulating property are mixed.

The upper electrode 320 may be disposed on the second control layer 130. The upper electrode 320 may be entirely disposed on the substrate 100. The upper electrode 320 may include an optically transparent transmissive electrode. The lights L1, L2, and L3 generated by the quantum dots 210 and 220 and the organic layer 120 of the third sub-pixel area PXc may pass through the upper electrode 320 and then be transmitted to the outside of the display device. The upper electrode 320 may include, for example, one of transparent conductive oxides (TCO) such as indium zinc oxide (IZO), indium tin oxide (ITO), indium gallium oxide (IGO), gallium zinc oxide (GZO), indium zinc gallium oxide (IGZO), fluorine tin oxide (FTO), and aluminum tin oxide (AZO), graphene, carbon nanotubes, conductive polymers, metals such as Ag, Al, Au, and Mo, and a mixture/compound thereof.

FIGS. 4 to 7 are plan views of the display device according to embodiments of the inventive concept. Differences with respect to the above-described embodiments will be mainly described, and detailed descriptions of duplicated components may be omitted.

Figure 4:
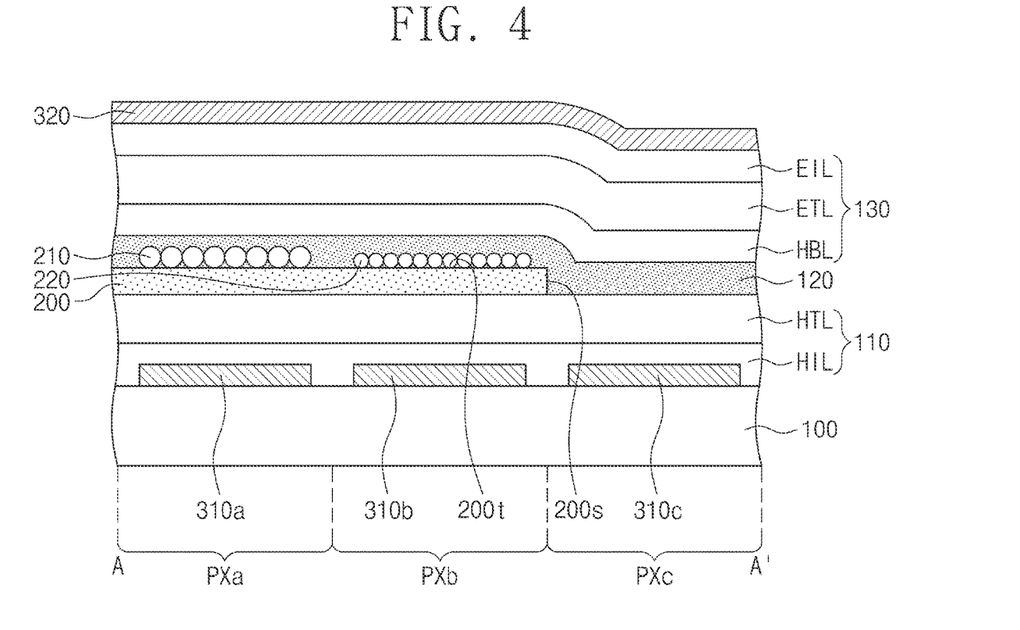
FIGS. 4 to 7 are plan views of a display device according to embodiments of the inventive concept.

Referring to FIG. 4, the organic layer 120 may conformally cover the first control layer 110 and the intervening layer 200. The top surface of the organic layer 120 of the first sub-pixel area PXa and the second sub-pixel area PXb may be disposed at a vertical level greater than that of the top surface of the organic layer 120 of the third sub-pixel area PXc. Also, the organic layer 120 may have a curved portion between the second sub-pixel area PXb and the third sub-pixel area PXc.

The second control layer 130 and the upper electrode 320 may be provided on the organic layer 120. The second control layer 130 may conformally cover the organic layer 120, and the upper electrode 320 may conformally cover the second control layer 130. The top surface of the second control layer 130 of the first sub-pixel area PXa and the second sub-pixel area PXb may be disposed at a vertical level greater than that of the top surface of the second control layer 130 of the third sub-pixel area PXc. The top surface of the upper electrode 320 of the first sub-pixel area PXa and the second sub-pixel area PXb may be disposed at a vertical level greater than that of the top surface of the upper electrode 320 of the third sub-pixel area PXc. Each of the second control layer 130 and the upper electrode 320 may have a uniform thickness from the first sub-pixel area PXa up to the third sub-pixel area PXc and may have a curved portion between the second sub-pixel area PXb and the third sub-pixel area PXc.

Figure 5:
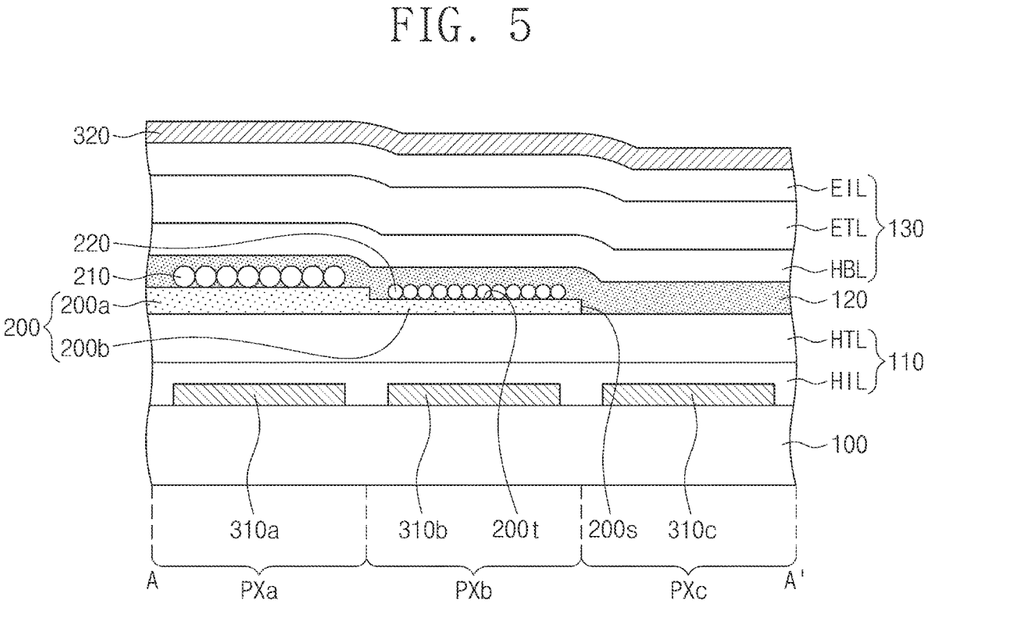

Referring to FIG. 5, the intervening layer 200 may have a stepped structure. Specifically, the intervening layer 200 may include a first portion 200a on the first sub-pixel area 310a and a second portion 200b on the second sub-pixel area 310b. The first portion 200a may have a thickness different from that of the second portion 200b. The thickness of the first portion 200a and the thickness of the second portion 200b may be selected according to wavelengths of light generated from the first sub-pixel area 310a and the second sub-pixel area 310b, respectively. The first sub-pixel area 310a and the second sub-pixel area 310b may have an optical resonant cavity matching the wavelength of light generated therefrom according to the thicknesses of the first portion 200a and the second portion 200b, respectively. Thus, color purity and light efficiency of the display device may be improved.

According to embodiments, the first portion 200a may have a thickness greater than that of the second portion 200b, and a top surface of the first portion 200a may be disposed at a level higher than that of a top surface of the second portion 200b. The intervening layer 200 may have a stepped portion between the first portion 200a and the second portion 200b. The stepped portion may be conformally covered by the organic layer 120.

The intervening layer 200 may differently control the charge carrier delivered from the first lower electrode 310a to the first quantum dots 210 and the charge carrier delivered from the second lower electrode 310b to the second quantum dots 220. The second portion 200b may have a thickness less than that of the first portion 200a and thus may have electrical resistance less than that of the first portion 200a. In addition, the second quantum dots 220 may be disposed adjacent to the first control layer 110 compared to the first quantum dots 210.

According to embodiments, unlike that illustrated in FIG. 5, the first portion 200a may have a thickness less than the second portion 200b, and the first quantum dots 210 may be disposed adjacent to the first control layer compared to the second quantum dots 220.

Figure 6:
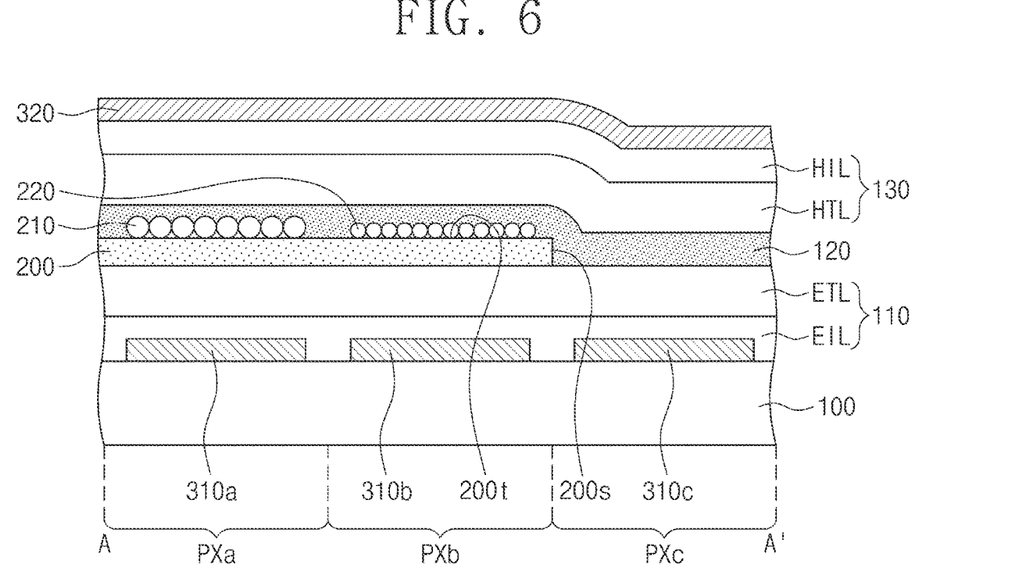

Referring to FIG. 6, the first control layer 110 may include an electron transport layer ETL and an electron injection layer EIL, and the second control layer 130 may include a hole injection layer HIL and a hole transport layer HTL.

Specifically, the electron injection layer EIL and the electron transport layer ETL may be sequentially laminated on the substrate 100. The electron injection layer EIL may cover the lower electrodes 310a, 310b, and 310c, and the electron transport layer ETL may be disposed on the electron injection layer EIL so as to be in directly contact with the organic layer 120 in the third sub-pixel area 310c.

The hole transport layer HTL may be provided on the organic layer 120 to conformally cover a top surface of the organic layer 120. The hole injection layer HIL may be provided on the hole transport layer HTL to conformally cover a top surface of the hole transport layer HTL.

The first control layer 110 may be an electron control layer for providing electrons to the organic layer 120, and the second control layer 130 may be a hole control layer for providing holes to the organic layer 120. According to embodiments, the first control layer 110 may further include a hole blocking layer, and the second control layer 130 may further include an electron blocking layer.

Figure 7:
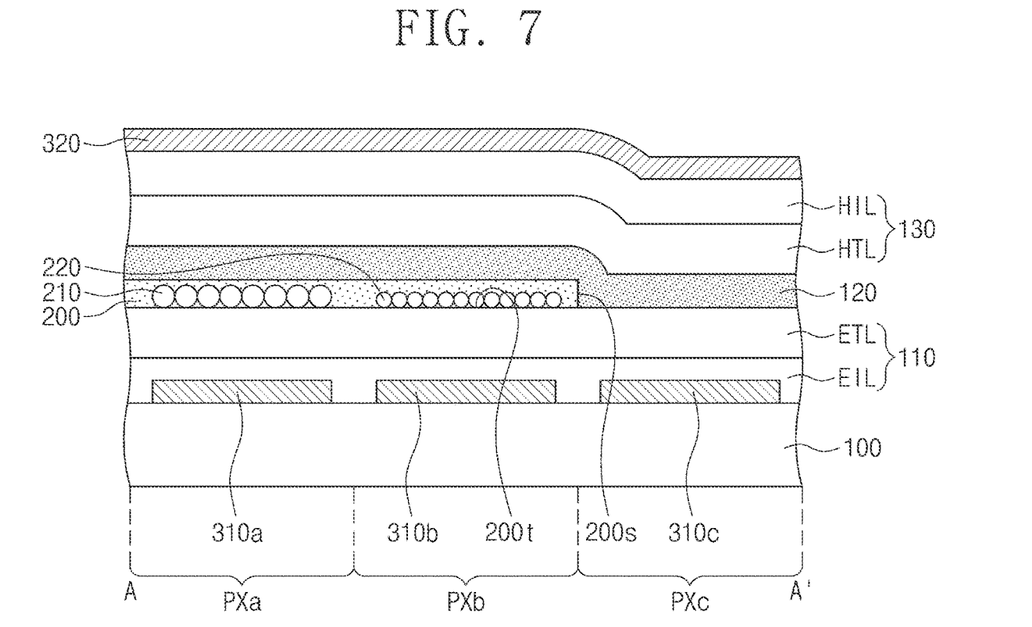

Referring to FIG. 7, the quantum dots 210 and 220 may be provided on the top surface of the first control layer 110 and covered by the intervening layer 200. The first quantum dots 210 and the second quantum dots 220 may be directly disposed on the electron transport layer ETL.

FIGS. 8 to 11 are cross-sectional views for explaining a method for manufacturing a display device according to embodiments of the inventive concept.

Figure 8:
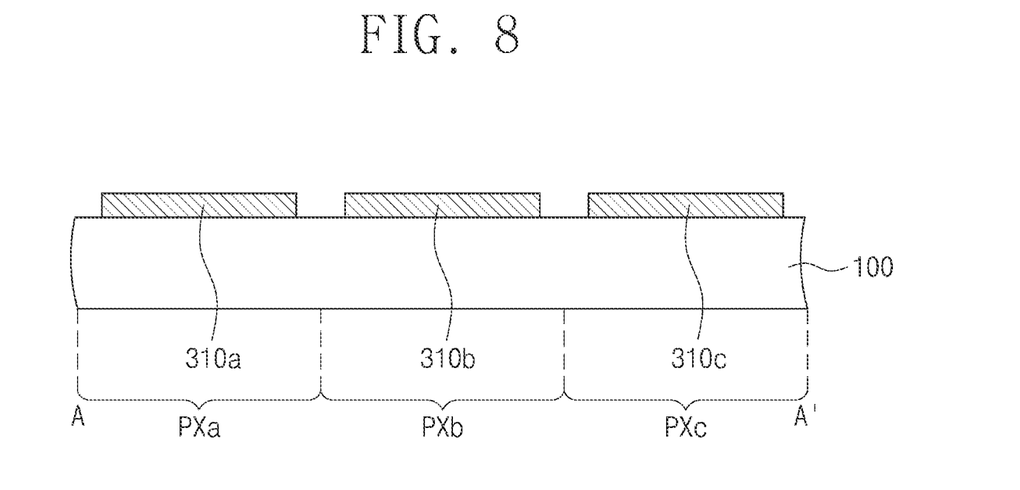
FIGS. 8 to 11 are cross-sectional views for explaining a method for manufacturing a display device according to embodiments of the inventive concept.

Referring to FIG. 8, lower electrodes 310a, 310b, and 310c may be formed on a substrate 100 including a first sub-pixel area PXa, a second sub-pixel area PXb, and a third sub-pixel area PXc. The forming of the lower electrodes 310a, 310b, and 310c includes forming a conductive layer covering a top surface of the substrate 100 and patterning the conductive layer to form the first sub-pixel area PXa, the second sub-pixel area PXb, and the third sub-pixel area PXc on the first lower electrode 310a, the second lower electrode 310b, and the third lower electrode 310c, respectively.

Figure 9:
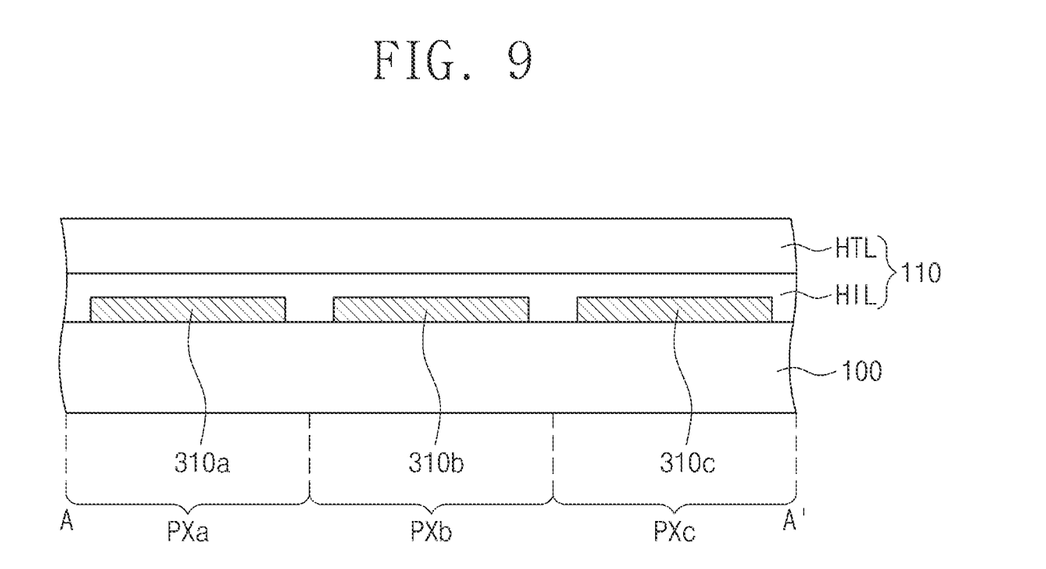

Referring to FIG. 9, a first control layer 110 covering the lower electrodes 310a, 310b, and 310c may be formed on the top surface of the substrate 100. The forming of the first control layer 110 may include sequentially forming a hole injection layer HIL and a hole transport layer HTL. According to embodiments, the hole injection layer HIL and the hole transport layer HTL may be formed by vacuum deposition, a coating process, and a heat treatment process. According to other embodiments, the hole injection layer HIL and the hole transport layer HTL may be formed by a vacuum deposition method, a slot-die coating method, a spin coating method, a blade coating method, a bar coating method, a rod coating method, a comma coating method, a pipetting method, a roll coating method, a spray coating method, a dispensing method, a stamping method, an imprinting method, a screen printing method, a gravure printing method, a flexo printing method, an offset printing method, an inkjet printing method and nozzle printing method, a casting method, a Langmuir-Blodgett (LB) method, a laser printing method, or a laser induced thermal imaging (LITI) method.

Figure 10:
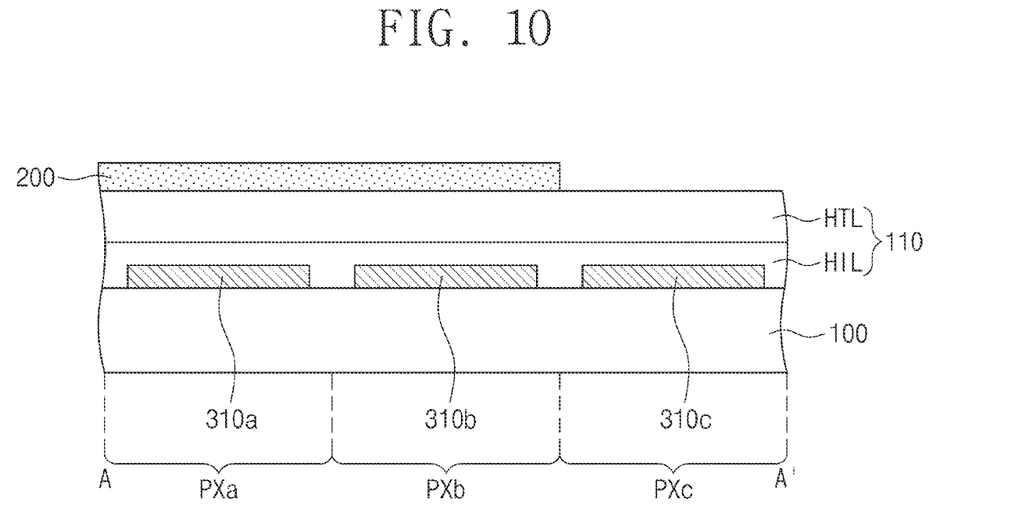

Referring to FIG. 10, an intervening layer 200 may be formed on the first control layer 110. According to embodiments, the forming of the intervening layer 200 may include forming a mask on the third sub-pixel area PXc, performing the coating process and the heat treatment process to form the intervening layer 200 on the first sub-pixel area PXa and the second sub-pixel area PXc, and removing a mask. Alternatively, the forming of the intervening layer 200 may include removing a portion of a preliminary intervening layer disposed on the third pixel area PXc after forming the preliminary intervening layer on the entire surface of the substrate 100.

Figure 11:
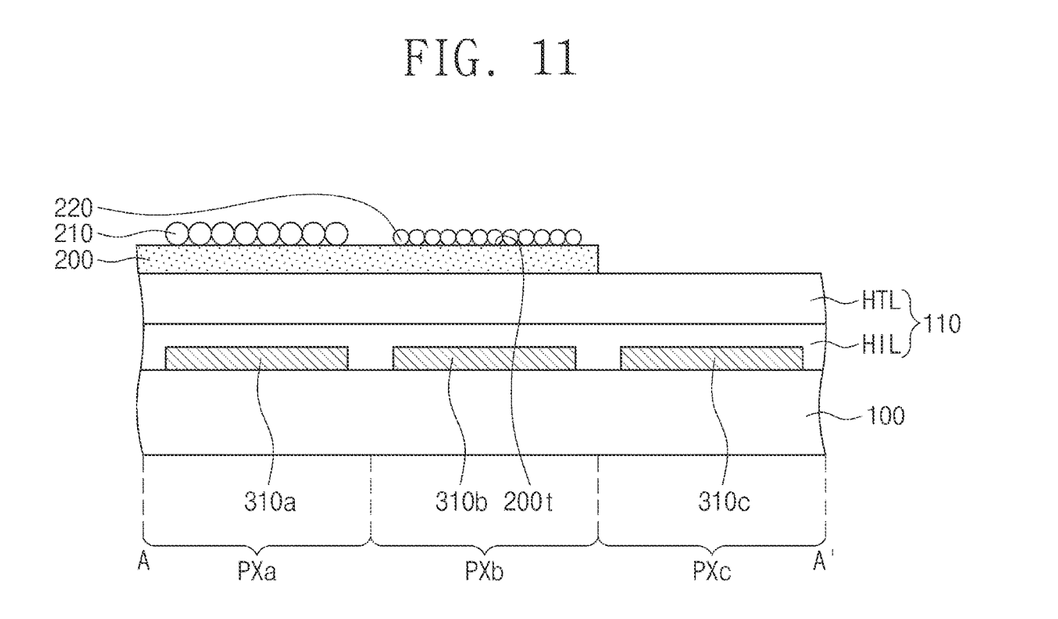

Referring to FIG. 11, quantum dots 210 and 220 may be formed on the intervening layer 200. The forming of the quantum dots 210 and 220 may include performing spin coating of a mixture including first quantum dots 210, second quantum dots 220, and a solvent on the intervening layer 200. Before performing the spin coating process, a first anchor material may be attached to a top surface of the intervening layer 200 of the first sub-pixel area PXa. The first anchor material may be coupled to the first quantum dots 210 to fix the first quantum dots 210 on the top surface of the intervening layer 200 of the first sub-pixel area PXa. The first anchor material may include, for example, one of a thiol group, a carboxyl group, a carbonyl group, and a hydroxyl group. Also, before performing the spin coating process, a second anchor material may be attached to the top surface of the intervening layer 200 of the second sub-pixel area PXb. The second anchor material may be coupled to the second quantum dots 220 to fix the second quantum dots 220 on the top surface of the intervening layer 200 of the second sub-pixel area PXb. The second anchor material may include, for example, one different from the first anchor material among the thiol group, the carboxyl group, the carbonyl group, and the hydroxyl group.

Referring back to FIG. 2, the forming of the organic layer 120 may include performing a deposition process on the first control layer 110 and the intervening layer 200 and planarizing a top surface of the organic layer 120. Alternatively, the organic layer 120 may be formed by a spin coating method, a casting method, an LB method, an inkjet printing method, a laser printing method, or a laser thermal transfer method. In this case, the organic layer 120 may be formed to conformally cover the first control layer 110 and the intervening layer 200 as illustrated in FIG. 4.

Subsequently, the second control layer 130 may be formed on the organic layer 120. The forming of the second control layer 130 may include sequentially forming a second hole blocking layer HBL, an electrode transport layer HBL, an electron transport layer ETL, and an electron injection layer EIL using the spin coating method, the casting method, the LB method, the inkjet printing method, the laser printing method, or the laser thermal transfer method. Subsequently, an upper electrode 320 may be attached on the second control layer 130.

In the display device according to the embodiments of the inventive concept, some of the sub-pixels within one pixel may emit light using the quantum dots, and other sub-pixels may emit light using the organic layer. Therefore, the display device that is easily manufactured and has the improved lifespan may be provided.

Those with ordinary skill in the technical field of the present invention pertains will be understood that the present invention can be carried out in other specific forms without changing the technical idea or essential features. Therefore, the above-disclosed embodiments are to be considered illustrative and not restrictive.

What is claimed is:
1. A display device comprising:
a substrate having a pixel area including a first sub-pixel area, a second sub-pixel area, and a third sub-pixel area;
a first control layer on the substrate;
a second control layer on the first control layer;
an intervening layer disposed between the first control layer and the second control layer on the first sub-pixel area and the second sub-pixel area;
first quantum dots only on a first portion of the intervening layer of corresponding to the first sub-pixel area;
second quantum dots only on a second portion of the intervening layer of corresponding to the second sub-pixel area; and
an organic emitting layer configured to cover a top surface and a side surface of the intervening layer between the first control layer and the second control layer;
wherein an upper surface of the intervening layer extends at a same vertical level across the first portion of the intervening layer and the second portion of the intervening layer to a side surface of the intervening layer; and
wherein the first quantum dots and the second quantum dots are on the upper surface of the intervening layer;
wherein
each of the first quantum dots has a core size within a first range,
each of the second quantum dots has a core size within a second range, and
wherein a maximum value of the first range is greater than a maximum value of the second range.

2. The display device of claim 1, wherein the first control layer comprises one of an electron control layer and a hole control layer, and
the second control layer comprises one of the electron control layer and the hole control layer, which is different from that of the first control layer.

3. The display device of claim 1, wherein a bottom surface of the organic emitting layer in an area corresponding to the first sub-pixel area is disposed at a vertical level higher than a vertical level of a bottom surface of the organic emitting layer in an area corresponding to the third sub-pixel area.

4. The display device of claim 1, wherein the first range is about 2 nm to about 8 nm and the second range is about 1 nm to about 4 nm.

5. The display device of claim 1, wherein the intervening layer has an energy level between an energy level of the first quantum dots and the first control layer.

6. The display device of claim 1, wherein the intervening layer has a dipole moment that reduces an energy barrier between the first quantum dots and the first control layer.

7. The display device of claim 1, wherein the intervening layer comprises an insulating material.

8. The display device of claim 7, wherein the intervening layer has a thickness in a range of about 0.1 nm to about 10 nm.

9. The display device of claim 1, wherein a top surface of the organic emitting layer in an area corresponding to the first sub-pixel area is disposed at a vertical level higher than a vertical level of a top surface of the organic emitting layer in an area corresponding to the third sub-pixel area.

10. The display device of claim 1, further comprising:
lower electrodes between the substrate and the first control layer; and
an upper electrode on the second control layer.

11. The display device of claim 10, wherein a top surface of the upper electrode of the first sub-pixel area is disposed at a vertical level higher than a vertical level of a top surface of the upper electrode of the third sub-pixel area.

12. The display device of claim 1, wherein the third sub-pixel area is configured to generate blue light.

13. The display device of claim 1, further comprising:
a first lower electrode on the first sub-pixel area; and
a second lower electrode on the second sub-pixel area;
wherein a bottom surface of the organic emitting layer of the first sub-pixel area is disposed at a vertical level higher than a vertical level of a bottom surface of the organic emitting layer of the second sub-pixel area;
wherein the organic emitting layer and the intervening layer directly contact a same hole transport layer of the first control layer; and
wherein the organic emitting layer directly contacts the first quantum dots and the second quantum dots.

14. The display device of claim 13, wherein the intervening layer is disposed between the quantum dots and the first control layer,
wherein the intervening layer has a side surface between the first lower electrode and the second lower electrode.

15. The display device of claim 13, wherein the first control layer comprises one of an electron control layer and a hole control layer, and
the second control layer comprises one of the electron control layer and the hole control layer, which is different from that of the first control layer.

16. The display device of claim 13, further comprising an upper electrode on the second control layer,
wherein the upper electrode vertically overlaps the first lower electrode and the second lower electrode.

17. The display device of claim 1, wherein the first quantum dots do not extend across the second sub-pixel area.

* * * * *